United States Patent [19]

Huang

[11] Patent Number: 5,378,649
[45] Date of Patent: Jan. 3, 1995

[54] PROCESS FOR PRODUCING NON-VOLATILE MEMORY DEVICES HAVING CLOSELY SPACED BURIED BIT LINES AND NON-OVERLAPPING CODE IMPLANT AREAS

[75] Inventor: Heng S. Huang, Taipei, Taiwan, Prov. of China

[73] Assignee: United Microelectronics Corporation, Hsinchu, Taiwan, Prov. of China

[21] Appl. No.: 224,696

[22] Filed: Apr. 8, 1994

[51] Int. Cl.[6] .......................................... H01L 27/112
[52] U.S. Cl. ........................................ 437/52; 437/45; 437/48
[58] Field of Search ...................... 437/45, 48, 58, 229; 257/390, 391; 365/178

[56] References Cited
U.S. PATENT DOCUMENTS

| | | | |
|---|---|---|---|
| 4,807,021 | 2/1989 | Okumura | 357/75 |
| 5,149,664 | 9/1992 | Shim et al. | 437/45 |
| 5,191,405 | 3/1993 | Tomita et al. | 257/777 |
| 5,200,355 | 4/1993 | Choi et al. | 437/45 |
| 5,202,754 | 4/1993 | Bertin et al. | 257/684 |

*Primary Examiner*—Tom Thomas
*Attorney, Agent, or Firm*—George O. Saile; Wolmar J. Stoffel

[57] ABSTRACT

This inventions provides a method to form metal lines with smaller line pitches than is possible using the conventional photolithographic single coating process. This invention provides for a double photolithographic process where the surface is coated, exposed and developed twice to form two sets of resist patterns. These resist patterns are used to form metal lines over all the buried bit lines. These metal lines provide better masking of the bit lines from the code implants thereby reducing bit line resistance and increasing ROM read speed.

26 Claims, 6 Drawing Sheets

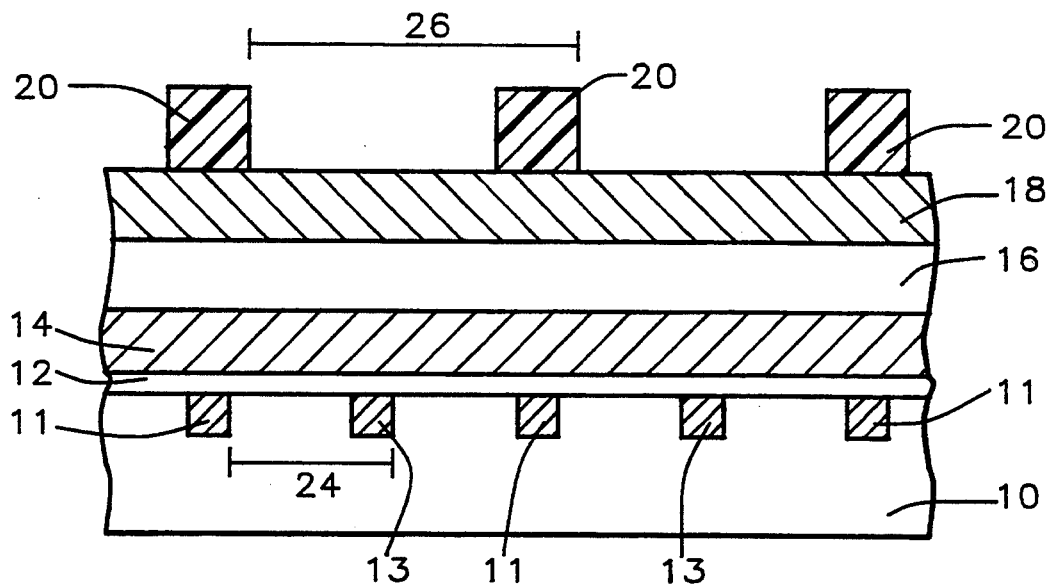
FIG. 1 — Prior Art
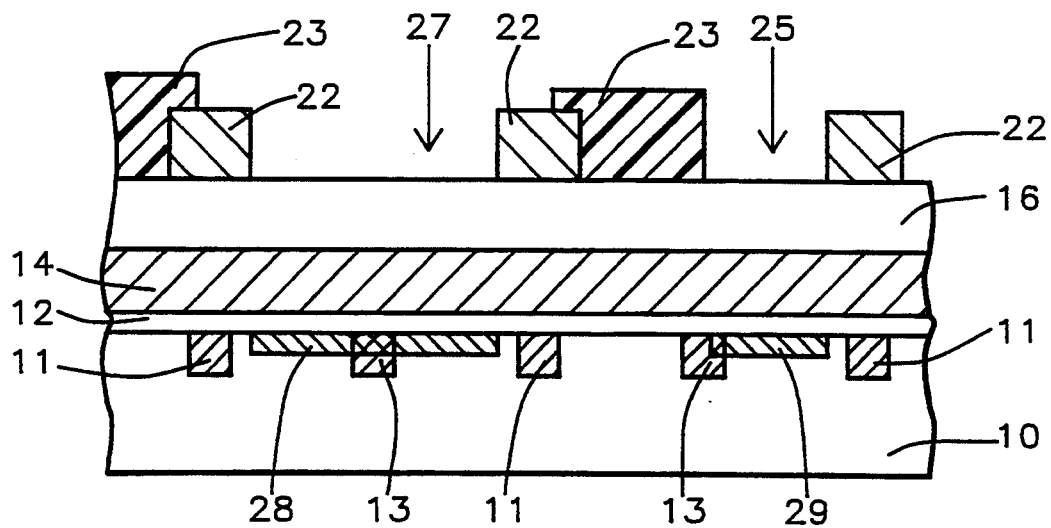
FIG. 2 — Prior Art

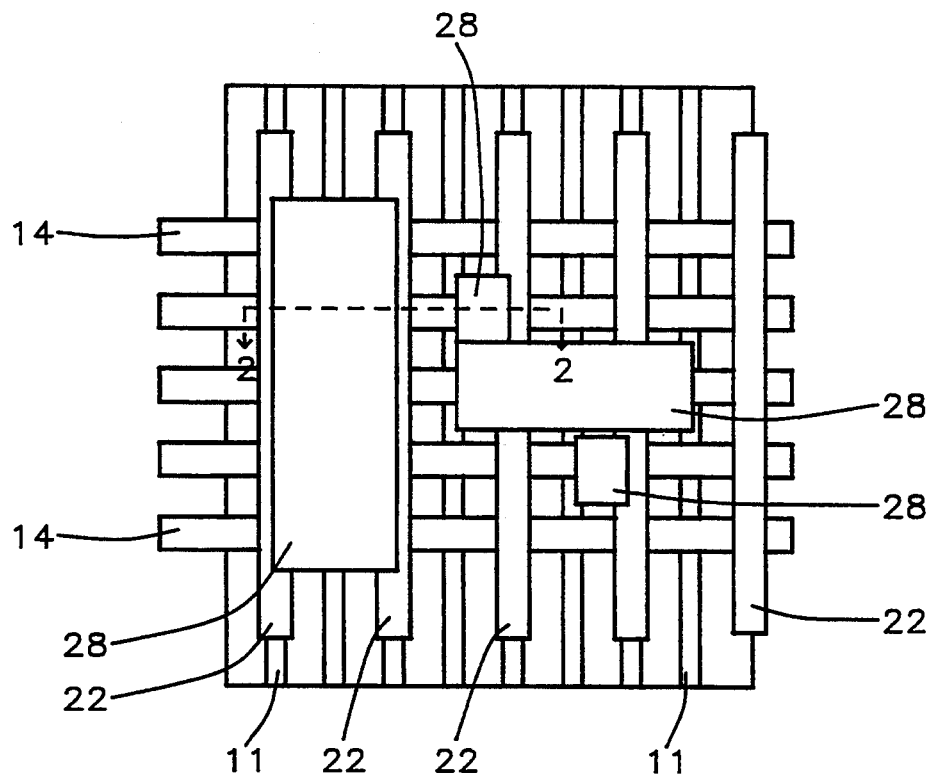
FIG. 2A – Prior Art
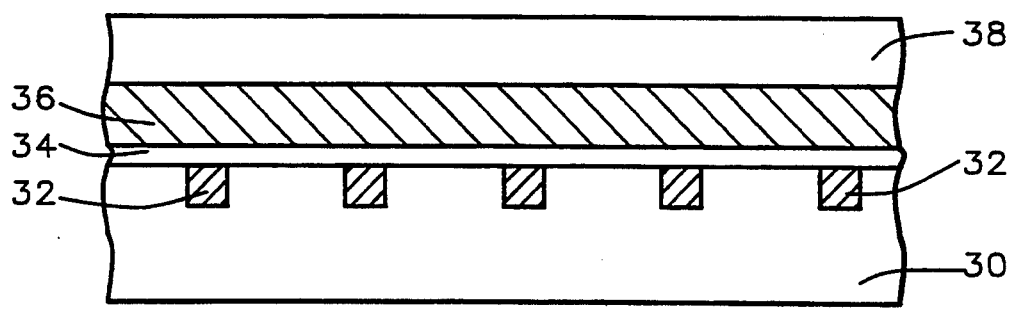
FIG. 3

PROCESS FOR PRODUCING NON-VOLATILE MEMORY DEVICES HAVING CLOSELY SPACED BURIED BIT LINES AND NON-OVERLAPPING CODE IMPLANT AREAS

BACKGROUND OF THE INVENTION (1) Field of the Invention

This invention relates to a memory type semiconductor device and in particular, to an improved process for forming closely spaced, buried conductive bit and code implant regions for ROM devices.

(2) Description of the Prior Art

To achieve microminiaturization of integrated circuit devices, individual elements have been made very small and the elements have been closely packed. As read only memory devices (i.e. ROM's) are scaled down in dimensions, there is a continuous challenge to maintain close spacings between the buried bit lines to obtain higher density cell structures. Also, the spacing between the bit lines and code implant areas is critical to maintaining consistent bit line resistances which is a important factor to ROM read speed. Code implants and bit lines are composed of an opposite type impurities (e.g., N+ bit lines and P+ code implants). A large bit line resistance due to a code impurity overlap will degrade the data reading speed. A conventional method to protect N+ buried lines from code impurity overlaps, is to use the metal lines as an implant mask. However, metal line pitches are normally larger than N+ line pitches. This is because the metal line photolithography and etching processes are not as precise as the photolithography and ion implant processes used to form buried N+ bit lines. As a result, the conventional method to protect the N+ buried line uses one metal line as a implant block for every other N+ buried bit line. It is not possible to use one metal line to cover each buried N+ line because the metal lines pitches are larger than the N+ buried line pitches. Because the conventional process uses metal lines as a code mask for only half the bit lines, the bit lines not protected by metal lines are often exposed to code implants which raises the bit line resistance thereby reducing the reading speed.

In the prior art process, as shown in FIGS. 1 and 2, buried N+ lines 11, 13 are implanted into substrate 10 using conventional implant processes. Next, thin insulating layer 12 is deposited on the substrate 10 surface. Then polysilicon word line 14 is deposited over oxide 12. Following this, glass layer 16 is deposited over polysilicon word lines 14 and insulating layer 12. Metal layer 18 is deposited over glass layer 16. Conventional photolithography processes are used to form photoresist lines 20 on the metal layer 18 and to form metal lines 22 shown in FIG. 2. The metal lines 22 are formed over every other bit line 11, leaving alternate bit lines 13 uncovered. It is not possible to place metal lines over every bit line because the minimum line pitch is larger for metal lines than for the bit lines. Line pitch is the distance between the one side of a line and the same side of an adjacent line. This is shown in FIG. 1, where pitch 24 illustrates the pitch of the buried bit lines and pitch 26 illustrates the pitch of the metal lines. Metal line pitch 26 is larger than bit line pitch 24 because of the larger inherent photolithography and etching imprecision in the metal process compared to the bit line implant and photolithography processes. Moreover, the metal etching process is not as precise as the bit line implantation process. Also, because of the uneven surface topology and other factors, the metal photolithography process is not as accurate as the bit line photolithography process.

Next, a photoresist layer is applied over the metal lines 22 and the glass layer 16. Using conventional photolithographic processes, opening are formed in the photoresist layer in areas where the code implants are desired. The remaining photoresist 23 is used as a code implant mask. When the bit lines are N+ type regions, a boron ion is normally used for the code implant. Next, the surface is implanted with boron forming code implant regions 28, 29 as shown in FIG. 2 and FIG. 2A. It should be noted that the metal lines 22 over the bit lines 11 act as a mask for the code implant therefore preventing overlap of the code implant and bit lines. Any overlap of boron code implant regions 28, 29 with the N-type bit lines 13 will increase the resistance of the bit line because of the compensation effect of p-type and n-type impurity mixing. Since in the conventional process only one half of the bit lines 11 are protected from code implant by a metal line, the bit lines 13 that are implanted with boron have a high resistance which reduces reading speed.

As shown in FIG. 2 and FIG. 2A, using the conventional process, when code implants 28 are required for two adjacent cells, the code implant overlaps the center bit line 13 thereby increasing bit line resistance and reducing the read speed. A memory cell is comprised of two adjacent bit lines and the channel region between the lines. As shown in FIG. 2 code implant 28, formed through opening 27, necessarily must overlap the bit line 13 since a metal is not covering bit line 13. The alternate situation is illustrated by opening 25. Code implant 29 partially overlaps bit line 13 while metal line 22 protects the adjacent bit line 11.

In addition, to reduce manufacturing costs, the processes utilized to achieve the bit and code patterns must be relatively simple, repeatable and use a minimum number to manufacturing steps.

SUMMARY OF INVENTION

An object of the present invention is to provide a process for forming a non-volatile memory device with closely spaced buried bit lines or code implant areas.

Another object of the present invention is to provide a process to precisely locate the code implant areas relative to the bit lines thereby reducing the possibility of increasing the bit line resistance by overlap of code implant and bit lines.

In accordance with the above objects, a process for fabricating a nonvolatile memory device on a monocrystalline silicon substrate with closely spaced buried conductive bit lines and code implant areas is provided. Using conventional processes, a plurality of parallel spaced conducive bit lines are formed in the substrate. A gate oxide layer is formed on the surface to the substrate. Next, using conventional semiconductor fabrication techniques, a plurality of parallel spaced polycrystalline silicon word lines arranged orthogonally relative to said bit lines are formed on the gate oxide layer. Next, a planar glass layer is deposited over the word lines. Then a metal layer is formed over the glass layer.

Following this, a first photoresist layer is formed over the metal layer. The first photoresist layer is exposed, developed and post baked to form a set of first photoresist lines which are located over alternate bit lines. Next, a second photoresist layer is formed over the metal layer and the first photoresist lines. The second photoresist layer is exposed and developed to form a second set of photoresist lines located over alternating bit lines so that now all the bit lines are covered by photoresist lines.

The above double photolithographic patterning process is required because the conventional single patterning process is not capable of producing metal line pitches as small as the bit line pitches. Therefore, the single pattern process is only capable of patterning metal lines over alternating bit lines. However, the double patterning process allows metal resist patterns to be formed over all bit lines.

Next conventional metal etching techniques are used to etch the exposed metal to form metal lines over every bit line. Subsequently, a code implant mask photoresist layer is formed over the metal lines and planar glass layer. Openings in the photoresist are formed in the areas where code ion implants are required. Impurity ions are implanted into the areas not covered by the metal lines and the photoresist.

The metal lines act as an implant mask to more precisely define the code implant areas. In this improved process, because metal lines overlie all the bit lines and act as a implant mask, the code implant does not overlap with the buried bit lines. Therefore, the bit line resistance in maintained and the read only memory (ROM) read speed is not reduced.

Next, the photoresist layer is removed. Finally, conventional semiconductor fabrication techniques are used to form and complete non-volatile memory devices.

Other objects, features and advantages of the present invention will become apparent from the following detailed description, when read in conjunction with the accompanying drawings.

BRIEF DESCRIPTIONS OF THE DRAWINGS

The drawings show the following:

FIG. 1 is a cross-section view in broken section in greatly enlarged scale that illustrate a non-volatile memory device structure of the prior art.

FIG. 2 is a cross-sectional view in broken section taken on line 2—2. FIG. 2A is a top plan view in broken section of the ROM device of the prior art.

FIGS. 3 through 9 are a sequence of cross sectional views in broken section in greatly enlarged scale that illustrate a non-volatile memory device structure having closely spaced buried bit and code lines in various stages of fabrication in accordance with the process of the invention.

FIG. 9 is a cross-sectional view in broken section taken on line 9—9 of FIG. 9A.

DETAILED DESCRIPTION OF THE PREFERRED EMBODIMENTS

Figure 4:
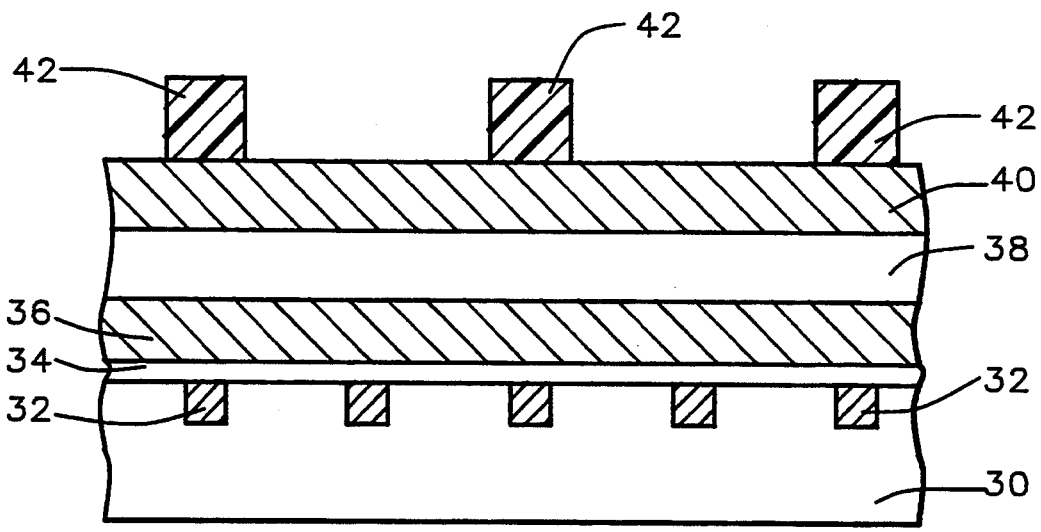

The present invention will be described in detail with reference to the accompanying drawings. It should be noted that the drawings are in greatly simplified form.

In practice, the memory device structure will include many individual memory cells interconnected by suitable metallurgy and contain appropriate addressing and interrogating circuitry on a common substrate. As shown in FIG. 3, substrate 30 shall be a monocrystalline silicon semiconductor body with many devices fabricated therein, as is well known in the art. The substrate 30 is preferable formed of monocrystalline silicon having a crystalline orientation of <100>. The background substrate or well dopant is preferably P type, with a concentration in the range of 1E16 to 1E17 atoms/cm$^3$. Parallel spaced buried bit lines 32 of an impurity type opposite the background impurity type of the substrate, typically formed by Arsenic or Phosphorous ion implantation with a dosage in the range of 5E14 to 1E16 ions/cm$^2$, are formed in the substrate 30. The bit lines have a spacing in the range of 0.3 to 1 micron, typically 0.5 microns and a width in the range of 0.1 to 0.6 microns, more preferably 0.2 to 0.5 microns, and typically a width of 0.3 microns.

As shown in FIG. 3, a thin gate oxide layer 34 is formed on the substrate 30. The gate oxide layer 34 had a thickness in the range of 80 to 250 Angstroms. Many parallel spaced polycrystalline silicon word lines 36 are formed on the gate layer 34 that are orthogonal to bit lines 32. The word lines 36 typically have a thickness in the range of 0.15 to 0.20 microns, a width in the range of 0.2 to 0.8 microns and a spacing with a range of 0.1 to 0.5 microns. Layer 36 is typically a conductive layer such as polysilicon or polycide and formed by a conventional low pressure chemical vapor deposition (LPCVD) process. Polycide is a well known structure for improving the conductivity of polysilicon. It basically consists of a polysilicon layer with an overlaying layer of a refractory metal that has been heated to form a refractory metal silicide surface layer. The word lines 36 are preferably doped with Phosphorous. Following this, a glass layer 38 having a planar top surface, is formed over the word lines 36. The planar glass layer 38 has a thickness in the range of 1,500 to 10,000 Angstroms, typically 6000 Angstroms. Layer 38 is typically a glass such as borophososilicate glass (BPSG).

Figure 5:
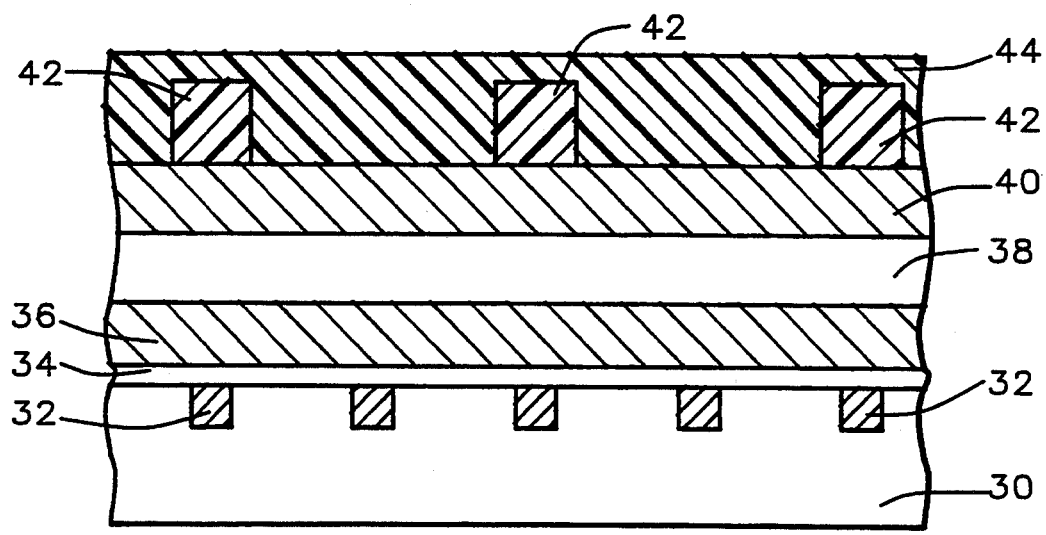
Figure 6:
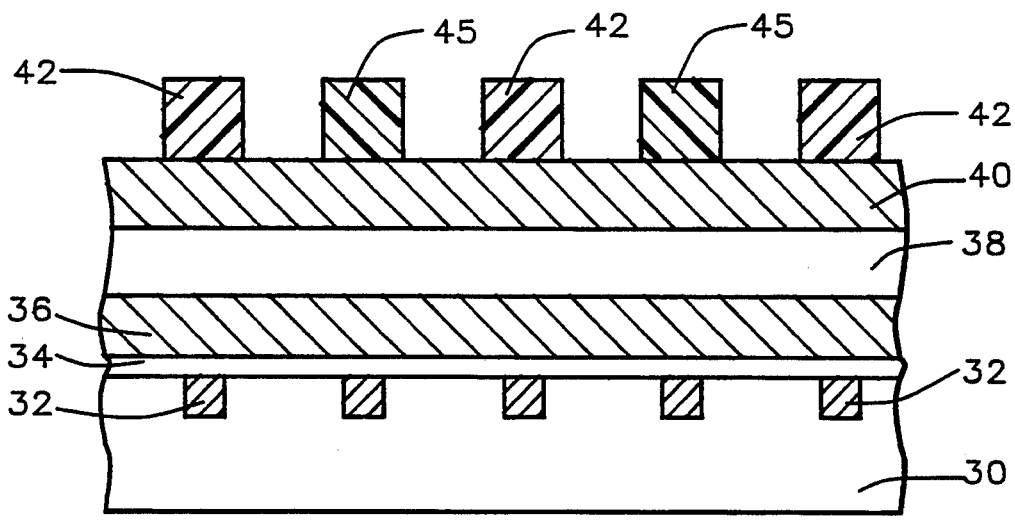

Then as illustrated in FIG. 4, a metal layer 40 is formed over the glass layer 38. The metal layer 40 is typically formed of aluminum alloy metal and has a thickness in the range of 6000 to 15,000 Angstroms. A photoresist layer is formed over the metal layer 40. The first photoresist layer is exposed and developed to form first masking resist lines 42 which define the metal lines over alternating bit lines. Next, as shown in FIG. 5 a second photoresist layer 44 is formed over the metal layer 40 and the first photoresist pattern 42. The second photoresist layer 40 is exposed and developed to form second pattern of masking resist lines 45 (shown in FIG. 6) which define metal lines over alternating bit lines so that every bit line 32 is covered with a photoresist line pattern 42, 45.

Figure 7:
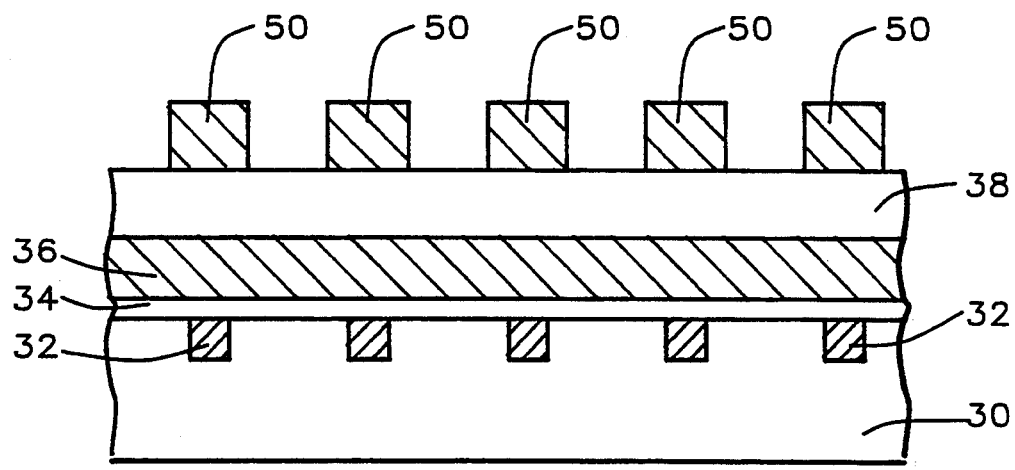
Figure 8:
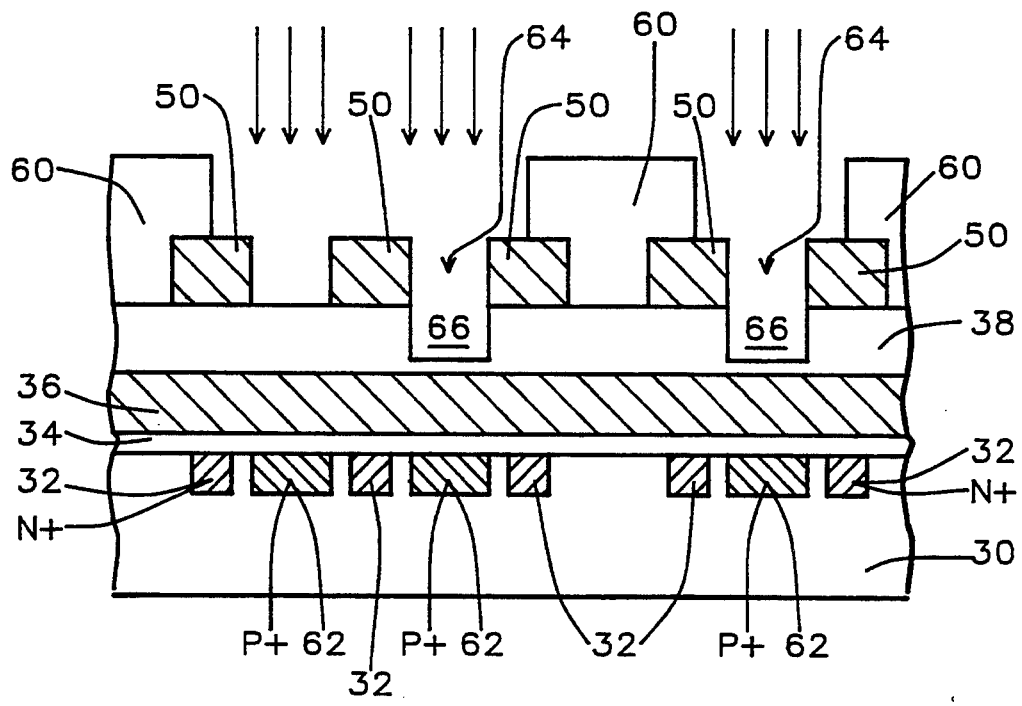
Figure 9:
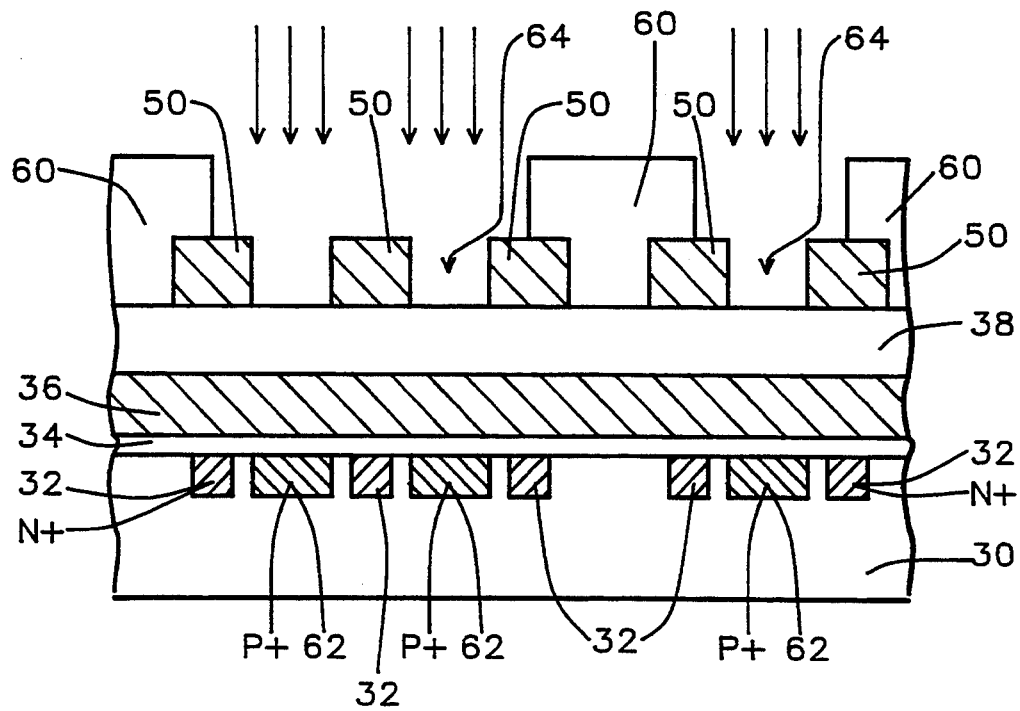

As shown in FIG. 7, the exposed areas of metal layer 40 is etched to form metal lines 50 which are positioned directly over the buried bit lines 32. The metal lines 50 are formed having a width slightly greater than the width of the bit line. The width of the metal lines are typically 0.2 microns greater than the width of the bit lines 32. Metal lines 50 typically have a width in the range of 0.3 to 0.5 microns and a thickness in the range of 0.6 to 1.5 microns and a spacing in the range of 0.1 to 0.5 microns. FIG. 8 and 9 show the photoresist code implant masking layer 60 formed over the metal lines 50. The photoresist layer is exposed and developed to define opens 64 which define the desired the code implant areas. The metal lines 50 are used to more accurately refine the location of the code implant areas relative to the bit lines 32.

Impurity ions of a type opposite the impurity type ions in bit lines 32 are implanted through the openings 64 in the photoresist masking layer 60 and the metal lines 50 to form buried code implant area 62. The implantation is typically achieved by implanting Boron ions at a voltage of 180 Kev and a dosage of approximately 5E14 atoms/cm$^2$. The spacing between the bit line 32 and the code implant area 62 is in the range of 0.05 to 0.5 microns.

FIG. 8 illustrates a possible process variation where the a thicker glass layer 38 is used. The glass layer 38 is etched prior to ion implant forming recessed regions 66. The resist layer 60 is used as a mask to anisotropically etch partially or completely through layer 38. The thinner glass layer 38 allows a lower energy code ion implant to be utilized. The thickness of layer 38 after the etch can be in the range of 0 to 2000 Angstroms. The low power ion implantation is typically achieved by implanting Boron ions at a voltage in the range of 120 to 180 keV and a dosage of approximately 5E14 ions/cm$^2$.

Figure 9A:
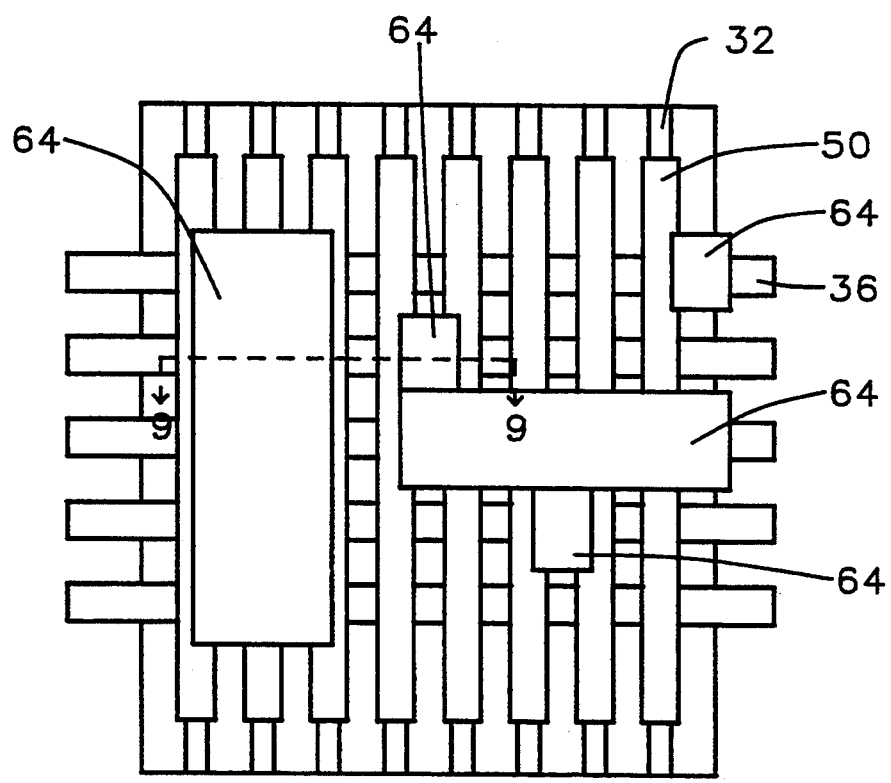
FIG. 9A is a top plan view in broken section of the ROM device of the invention.

FIG. 9A is a top plan view illustrating the various elements of the previously described memory device.

Finally, conventional semiconductor fabrication techniques are used to complete the non-volatile memory device.

While the invention has been particularly shown and described with reference to the preferred embodiments thereof, it will be understood by those skilled in the art that various changes in form and details may be made without departing from the spirit and scope of the invention.

What is claimed is:

1. An improved process for making code implants in a nonvolatile read only memory device comprising the steps of:
   forming a plurality of parallel spaced conductive buried bit lines of a first impurity type in a semiconductor substrate having a background impurity of a second opposite impurity type,
   forming a gate oxide layer over the substrate surface,
   forming a plurality of parallel spaced polycrystalline silicon word lines arranged orthogonally relative to said bit lines,
   forming a glass layer having a planar surface over the word lines,
   forming a metal layer over the glass layer,
   forming, exposing, developing a first photoresist layer on said metal layer surface to form a plurality of first masking resist lines directly over alternating buried bit lines,
   forming, exposing, developing a second photoresist layer on said metal layer to form a plurality of second masking resist lines directly over the remaining buried bit lines so that resist lines overlie all bit lines,
   etching the exposed portions of the metal layer resulting in a plurality of parallel spaced metal line directly over all bit lines,
   removing the first and second masking resist lines,
   applying a photoresist masking layer on the substrate,
   exposing and developing the photoresist layer to define a pattern of code openings,
   ion implanting suitable impurity ions through the code openings in the photoresist mask using the metal lines to further define the implant area to provide code implants in the substrate, and
   removing the photoresist layer.

2. The process of claim 1 wherein said semiconductor substrate has a p type background impurity, said conductive bit lines are formed of N type impurity, and said code implant areas are formed of a P type impurity 3. The process of claim 1 wherein the semiconductor substrate has a well with a background impurity of a second type.

4. The process of claim 2 wherein the parallel spaced conductive bit lines are formed of Arsenic impurity ions of a with a ion implant dosage in the range of 5E14 to 1E16 ions/cm$^2$.

5. The process of claim 2 wherein the buried bit lines have a final width of 0.1 to 0.6 microns and a spacing of 0.3 to 1.0 microns.

6. The process of claim 2 where buried bit lines are formed by Arsenic implantation with a dosage in the range of 5E14 to 1E16 atoms/cm$^2$.

7. The process of claim 1 where the gate oxide has a thickness in the range of 80 to 250 Angstroms.

8. The process of claim 2 where the parallel spaced polycrystalline silicon word lines are doped with Phosphorous.

9. The process of claim 8 where the word lines have a width of 0.2 to 0.8 microns and a spacing of 0.1 to 0.5 microns.

10. The process of claim 1 where the glass layer is composed of a borophososilicate glass material.

11. The process of claim 10 where the glass layer has a thickness of 1,500 to 10,000 Angstroms.

12. The process of claim 1 where said metal lines are composed of an aluminum alloy material.

13. The process of claim 12 where the metal lines have a width in the range of 0.3 to 0.5 microns and a thickness in the range of 6,000 to 15,000 Angstroms and a spacing of 0.1 to 0.5 microns.

14. The process of claim 1 wherein a portion on the glass layer in the opening in the code pattern is removed, and said code implant to accommodate for a low energy code implant.

15. The process of claim 1 wherein the width of said spaced metal lines is greater the width of said buried bit lines.

16. The process of claim 1 wherein the code implantation is typically achieved by implanting Boron ions at a voltage of 180 keV and a dosage of approximately 5E14 atoms/cm$^2$.

17. An improved process for making code implants which do not overlap buried lines comprising the steps of:
    forming a plurality of parallel spaced conductive buried bit lines of a first impurity type in a semiconductor substrate having a background impurity of a second opposite impurity type,
    forming a gate oxide layer over the substrate surface,
    forming a plurality of parallel spaced conductive word lines arranged orthogonally relative to said bit lines,
    forming an insulating layer over the word lines,
    forming a layer of ion implant impervious masking material over the insulating layer,
    forming, exposing, developing a first resist layer on said layer of ion implant masking material surface to form a plurality of first masking resist lines directly over alternating buried bit lines.
    forming, exposing, developing a second resist layer on said layer of ion implant impervious masking material to form a plurality of second masking resist lines directly over the remaining buried bit lines so that resist lines overlie all bit lines.

etching the exposed portions of the layer of ion implant impervious material resulting in a plurality of parallel spaced lines of ion implant impervious material directly over all bit lines, applying a code implant masking layer with openings used to define the areas for code implant on the substrate, ion implanting suitable impurity ions through the code openings in the code implant masking layer using the lines of ion implant impervious material to further define the implant area to provide code implants in the substrate.

18. The process of claim 17 wherein the conductive word lines are formed of a material selected from the group consisting of: polycrystalline silicon or polycide and mixtures thereof.

19. The process of claim 17 wherein the insulating layer is a glass layer.

20. The process of claim 19 where the glass layer is borophososilicate glass.

21. The process of claim 17 wherein the layer of ion implant impervious material is formed of metal.

22. The process of claim 17 wherein the layer of ion implant impervious material is formed of polycide.

23. The process of claim 17 wherein the layer of ion implant impervious material is formed of polysilicon.

24. The process of claim 21 wherein the layer of metal is an aluminium alloy.

25. The process of claim 17 wherein the etch of the ion implant impervious layer is an anisotropic etch.

26. The process of claim 17 where the lines of ion implant impervious material have a width in the range of 0.3 to 0.5 microns and a thickness in the range of 6000 to 15,000 Angstroms and a spacing of 0.1 to 0.5 microns.

* * * * *